(12) United States Patent
Garbar et al.

(10) Patent No.: US 10,240,050 B2
(45) Date of Patent: Mar. 26, 2019

(54) PROCESS FOR PREPARING TRANSPARENT CONDUCTIVE COATINGS

(71) Applicant: Clearview Films Ltd., Industrial Park Caesarea (IL)

(72) Inventors: Arkady Garbar, Lakeville, MN (US); Eric L. Granstrom, Andover, MN (US); Joseph Masrud, Philadelphia, PA (US)

(73) Assignee: Clearview Films Ltd., Industrial Park Caesarea (IL)

( * ) Notice: Subject to any disclaimer, the term of this patent is extended or adjusted under 35 U.S.C. 154(b) by 158 days.

(21) Appl. No.: 14/345,524

(22) PCT Filed: Sep. 19, 2012

(86) PCT No.: PCT/IB2012/002404
§ 371 (c)(1),
(2) Date: Mar. 18, 2014

(87) PCT Pub. No.: WO2013/041971
PCT Pub. Date: Mar. 28, 2013

(65) Prior Publication Data
US 2014/0356596 A1 Dec. 4, 2014

Related U.S. Application Data

(60) Provisional application No. 61/536,122, filed on Sep. 19, 2011.

(51) Int. Cl.
*B44C 1/22* (2006.01)
*C03C 15/00* (2006.01)
(Continued)

(52) U.S. Cl.
CPC ............... *C09D 5/24* (2013.01); *B05D 3/007* (2013.01); *C23F 1/02* (2013.01); *G03F 7/165* (2013.01);
(Continued)

(58) Field of Classification Search
CPC ........................................................ C09D 5/24
(Continued)

(56) References Cited

U.S. PATENT DOCUMENTS 5,399,202 A 3/1995 Kikuchi et al.
6,462,414 B1 * 10/2002 Anderson ..................... 257/738
(Continued)

FOREIGN PATENT DOCUMENTS

WO WO 2008/091279 7/2008
WO WO 2009/086161 7/2009

OTHER PUBLICATIONS

"Methyl ethyl ketone", webpage, no date.*
(Continued)

*Primary Examiner* — Thomas T Pham
(74) *Attorney, Agent, or Firm* — Bradley Arant Boult Cummings LLP

(57) ABSTRACT

A method of producing an article is described. The method includes (a) providing a substrate comprising an etchable surface layer; (b) coating the etchable surface layer with a composition comprising a non-volatile, etch-resistant component in a volatile liquid carrier; and (c) drying the composition to remove the liquid carrier, whereupon the non-volatile, etch-resistant component self-assembles to form etch-resistant traces on the etchable surface layer. The liquid carrier is in the form of an emulsion comprising a continuous phase and a second phase in the form of domains dispersed in the continuous phase.

10 Claims, 9 Drawing Sheets

(51) Int. Cl.

| | |
|---|---|
| *C03C 25/68* | (2006.01) |
| *C23F 1/00* | (2006.01) |
| *C25F 3/00* | (2006.01) |
| *C09D 5/24* | (2006.01) |
| *C23F 1/02* | (2006.01) |
| *G03F 7/16* | (2006.01) |
| *B05D 3/00* | (2006.01) |

(52) U.S. Cl.
CPC .................. *Y10T 428/24802* (2015.01); *Y10T 428/24917* (2015.01)

(58) Field of Classification Search
USPC .......................................................... 216/41
See application file for complete search history.

(56) References Cited

U.S. PATENT DOCUMENTS

| | | | |
|---|---|---|---|
| 7,566,360 B2 | 7/2009 | Garbar et al. | |
| 7,601,406 B2 | 10/2009 | Garbar et al. | |
| 7,736,693 B2 | 6/2010 | Garbar et al. | |
| 2003/0003393 A1* | 1/2003 | Yamaguchi et al. | 430/270.1 |
| 2005/0084794 A1* | 4/2005 | Meagley et al. | 430/270.1 |
| 2005/0189136 A1* | 9/2005 | Kawasaki et al. | 174/255 |
| 2005/0215689 A1* | 9/2005 | Garbar et al. | 524/440 |
| 2007/0241077 A1 | 10/2007 | Kochi et al. | |
| 2008/0107863 A1* | 5/2008 | Ikeda et al. | 428/137 |
| 2009/0045552 A1* | 2/2009 | Imai et al. | 264/488 |
| 2009/0176177 A1* | 7/2009 | Han | G03F 7/0392 430/325 |
| 2010/0233589 A1 | 9/2010 | Chun | |
| 2010/0237763 A1 | 9/2010 | Shiraga et al. | |
| 2010/0273282 A1 | 10/2010 | Kim et al. | |
| 2011/0001153 A1 | 1/2011 | Tchakarov et al. | |
| 2011/0159699 A1* | 6/2011 | Gabriel | H01L 21/31116 438/725 |
| 2011/0181169 A1* | 7/2011 | Eden | H05H 1/24 313/231.31 |

OTHER PUBLICATIONS

"Nanoparticle", webpage, no date.*
International Preliminary Report on Patentability in International Application No. PCT/IB2012/002404, dated Apr. 3, 2014, 10 pages.
International Search Report and Written Opinion in International Application No. PCT/IB2012/002404, dated Mar. 22, 2013, 19 pages.

* cited by examiner

Etched Copper

Reflected (3a) and transmitted (3b) optical micrographs of etched copper.

Etched Aluminum

PROCESS FOR PREPARING TRANSPARENT CONDUCTIVE COATINGS

CROSS-REFERENCE TO RELATED APPLICATIONS

This application is a National Stage application under 35 U.S.C. § 371 of International Application No. PCT/IB2012/002404, having an International Filing Date of Sep. 19, 2012, which claims the benefit of priority to U.S. Provisional Application Ser. No. 61/536,122, filed on Sep. 19, 2011. The disclosure of the prior application is considered part of (and is incorporated by reference in) the disclosure of this application.

TECHNICAL FIELD

This disclosure relates to a process for preparing transparent conductive coatings.

BACKGROUND

Transparent conductive coatings formed of metals, metal oxides, or polymers have wide applications. For example, flat panel displays of computers, TV, or other devices may include one or more layers of the transparent conductive coatings that transmit images and allow local electrical control of pixel color or intensity of the images. The transparent conductive coatings can also be used in photovoltaic cells, touch screens, LEDs including OLEDs, heaters for glass windows, and electromagnetic interference filters.

SUMMARY

In one aspect, the disclosure features a method of producing an article. The method comprises (a) providing a substrate comprising an etchable surface layer; (b) coating the etchable surface layer with a composition comprising a non-volatile, etch-resistant component in a volatile liquid carrier; and (c) drying the composition to remove the liquid carrier, whereupon the non-volatile, etch-resistant component self-assembles to form etch-resistant traces on the etchable surface layer. If desired, areas of the etchable surface layer not covered by the etch-resistant traces may then be etched to expose the underlying substrate. The liquid carrier is in the form of an emulsion comprising a continuous phase and a second phase in the form of domains dispersed in the continuous phase.

In another aspect, the disclosure features an article prepared according to the process of (a)-(c).

In another aspect, the disclosure features a method of producing an article. The method comprises (a) providing a substrate comprising a metallized surface layer; (b) coating the metallized surface layer with a composition comprising a non-volatile, etch-resistant component in a volatile liquid carrier; and (c) drying the composition to remove the liquid carrier, whereupon the non-volatile, etch-resistant component self-assembles to form interconnected etch-resistant traces on the metallized surface layer defining randomly shaped cells. If desired, the areas of the metallized surface layer not covered by the etch-resistant traces may then be etched to expose the underlying substrate. The composition is essentially free of nanoparticles and the liquid carrier is in the form of an emulsion comprising aqueous domains dispersed in a continuous phase comprising an organic solvent that evaporates more quickly than the aqueous domains.

In another aspect, the disclosure features an article prepared according to the process of (a)-(c).

Implementations may include one or more of the following features. The etch-resistant traces may be removed to expose areas of the etchable surface layer underlying the etch-resistant traces. The etchable surface layer may include a metallized layer. The metallized layer may be selected from the group consisting of copper, silver, aluminum, and combinations thereof. The etchable surface layer may be in the form of a substantially continuous layer on the substrate. The composition may be essentially free of nanoparticles. The composition may further include an etching agent that etches areas of the etchable surface layer not covered by the etch-resistant traces while drying the composition to remove the liquid carrier. The non-volatile, etch-resistant component may include a photoresist. The non-volatile, etch-resistant component may include a water-insoluble material selected from the group consisting of Novolac resins, epoxy resins, polyester polyols, alkanes and derivatives thereof having at least 15 carbon atoms, and combinations thereof. The domains dispersed in the continuous phase may include aqueous domains and the continuous phase of the emulsion comprises an organic solvent that evaporates more quickly than the aqueous domains. Etching areas of the etchable surface layer not covered by the etch-resistant component may include exposing the areas to a plasma, acid, or base. Etching may be accomplished using an applied electrical bias, whether constant, pulsed, or sinusoidally varying applied between the metal substrate and an etchant bath. The substrate may be transparent to visible light in the absence of the etchable surface layer.

In another aspect, the disclosure features a composition that is essentially free of nanoparticles and includes a non-volatile, etch-resistant component in a volatile liquid carrier. The volatile liquid carrier is in the form of an emulsion that includes a continuous organic phase and an aqueous phase in the form of domains dispersed in the continuous phase. The continuous organic phase, in turn, includes an organic solvent that evaporates more quickly than the aqueous phase, while the aqueous phase is selected from the group consisting of water, water-miscible organic solvents, and combinations thereof. The non-volatile, etch-resistant component includes a water-insoluble material selected from the group consisting of Novolac resins, epoxy resins, polyester polyols, alkanes and derivatives thereof having at least 15 carbon atoms, and combinations thereof. When the composition is coated onto a substrate and dried, the non-volatile, etch-resistant component self-assembles to form interconnected, etch-resistant traces on the substrate that define randomly shaped cells.

The details of one or more embodiments of the invention are set forth in the accompanying drawings and the description below. Other features, objects, and advantages of the invention will be apparent from the description and drawings, and from the claims.

DETAILED DESCRIPTION

Figures 1A, 1B, 1C, 1D, 1E, 1F, 1G:
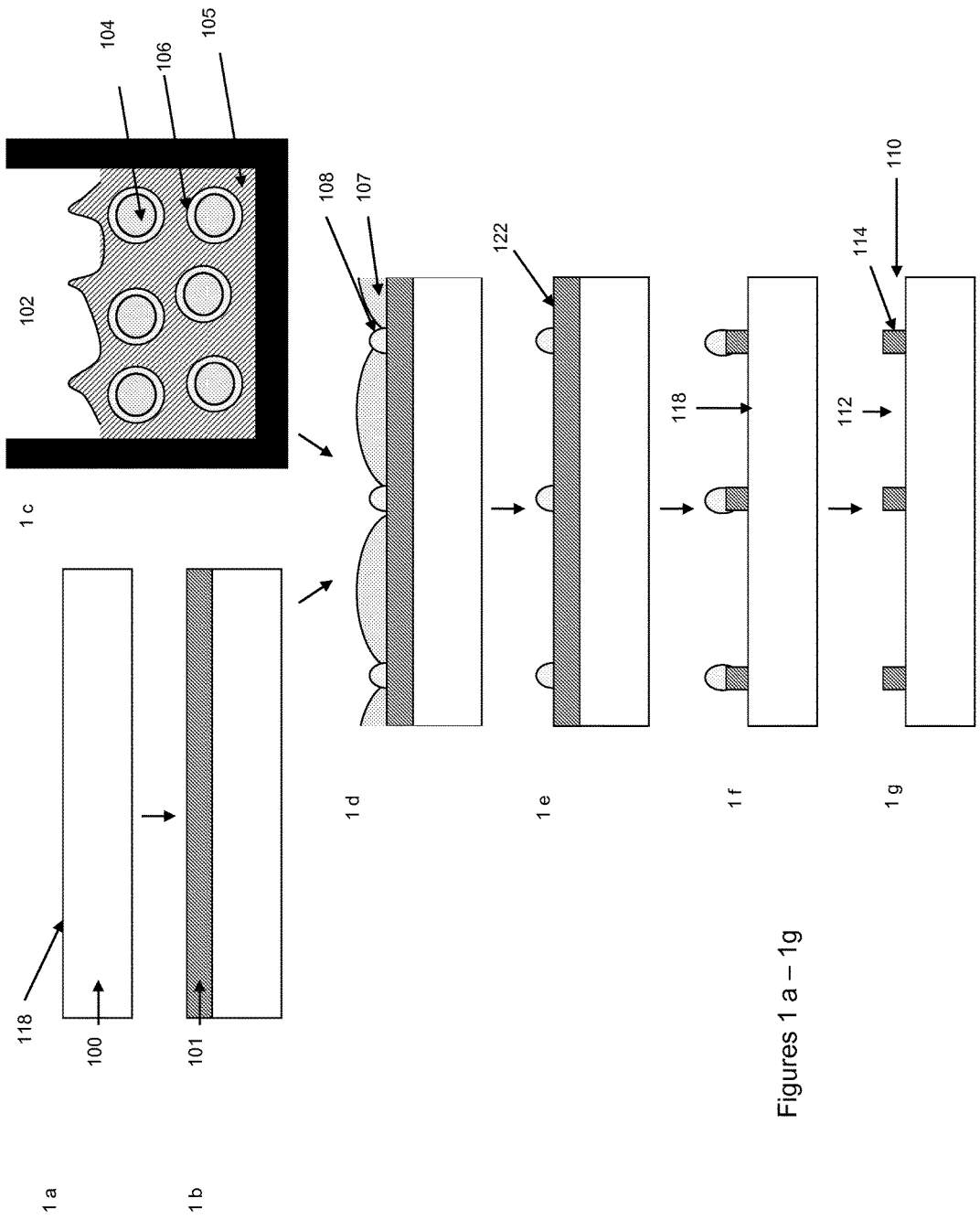
FIGS. 1A-1G are schematic diagrams showing a process of making a transparent conductive coating.
Figure 2:
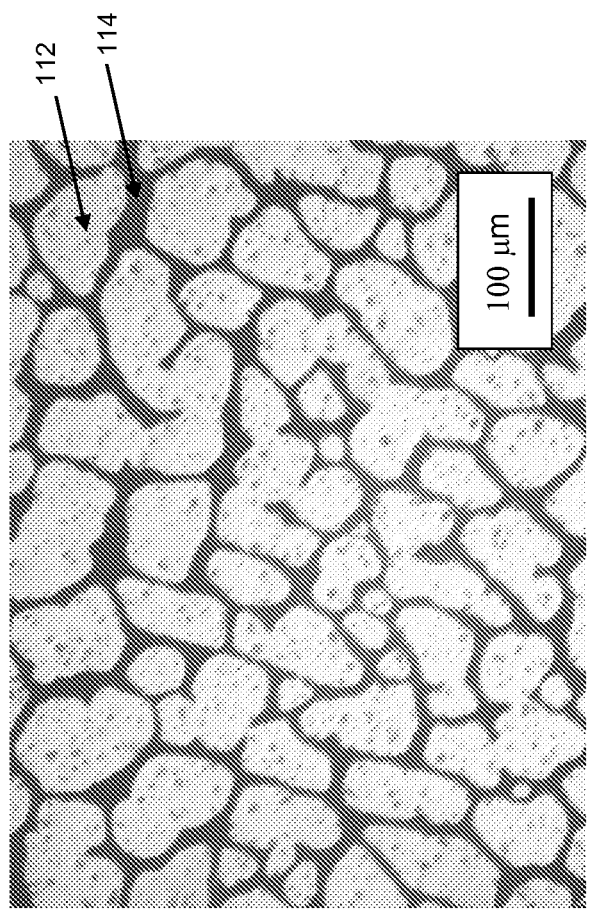
FIG. 2 is a scanned electron micrograph of a transparent copper conductive coating.
Figure 3:
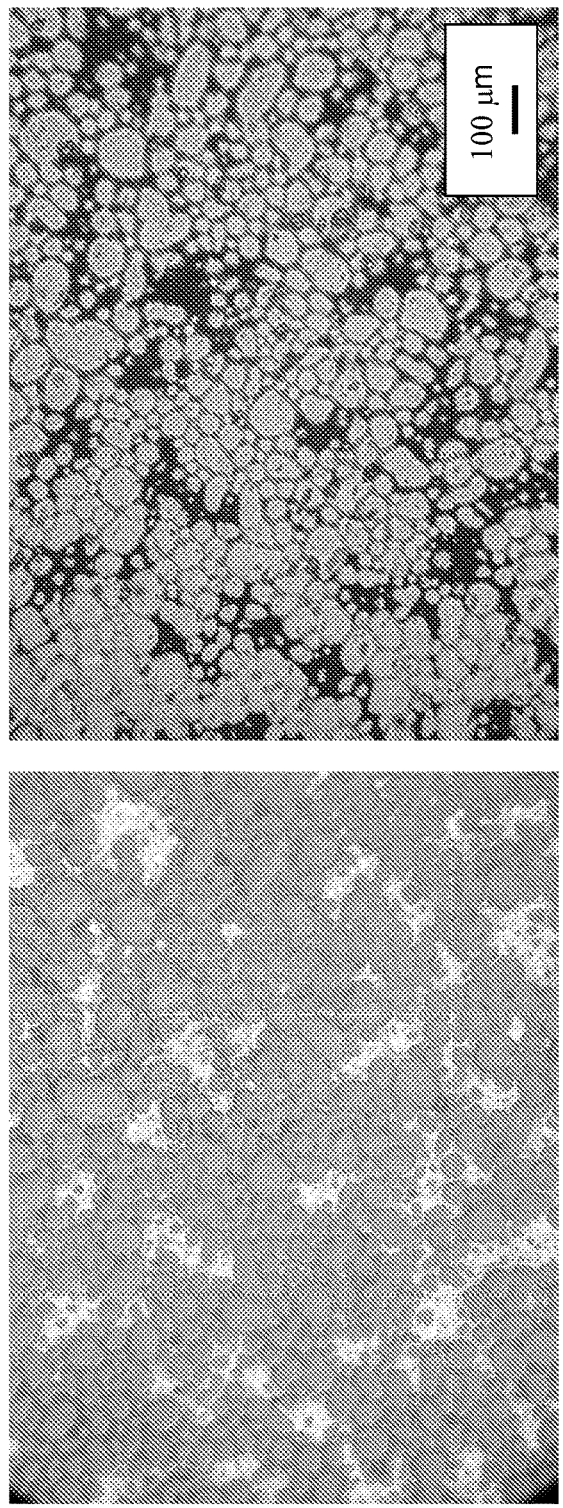
FIGS. 3A and 3B are optical micrographs of a transparent copper conductive coating in reflected and transmitted modes.

A transparent conductive coating 110 is formed on a substrate 100 using a process shown in FIGS. 1A-1G. As shown in FIGS. 1G and 2, the transparent conductive coating 110 includes interconnected networks, e.g., meshes, formed of metal traces 114 defining cells 112, e.g., pores (see also, FIGS. 3-10). The network can have a random pattern or a regular pattern.

Referring to FIGS. 1A and 1B, to form the transparent conductive coating 110, a continuous metal layer 101 is coated on the substrate 100. Metals suitable for use in the metal layer 101 can include, e.g., copper, silver, aluminum, nickel, zinc, gold, or semiconductors such as silicon, germanium, zinc oxide, tin oxide, or doped versions of semiconductors, or alloys of any of the above metallic materials, or multilayers of the above materials or those materials with dielectric interlayers between them. In some implementations, the metal layer 101 is substantially free of any organic materials.

The thickness of the metal layer 101 can be chosen based on the desired thickness of the transparent conductive coating 110 to be formed. In some implementations, the thickness of the metal layer 101 is the same as the thickness of the transparent conductive coating 110 and is about 10 nanometers to about 10 microns thick. Typical thickness values are on the order of 0.1 to 10 microns. The metal layer 101 can have a substantially uniform thickness over the entire substrate 100, or can have a thickness that varies in different regions of the substrate surface 118 (not shown). In some implementations, the metal layer 101 can be discontinuous (not shown), e.g., covering only selected regions of the substrate surface 118.

The substrate 100 is preferably transparent to visible light in the absence of the etchable surface layer or a photoactive material itself, e.g. silicon, germanium, and cadmium telluride (CdTe), such as would be of use in a photovoltaic cell. Examples of suitable substrates include glass, paper, metal, ceramics, textiles, printed circuit boards, and polymeric films or sheets. The substrate 100 can be flexible or rigid. Suitable polymeric films can include polyesters, polyamides, polyimides (e.g., Kapton® by Dupont in Wilmington, Del.), polycarbonates, polyethylene, polyethylene products, polypropylene, polyesters such as PET and PEN, acrylate-containing products, polymethyl methacrylates (PMMA), epoxy resins, their copolymers or any combination thereof, or any other transparent or printable substrate.

In some implementations, the substrate 100 can be treated with corona treatment to improve the bonding of the metal layer 101 to the substrate 100. Alternatively or additionally, a primer layer (not shown) can be applied between the substrate 100 and the metal layer 101 to improve the bonding of the metal layer 101 to the substrate 100.

Conventional deposition and coating methods can be used to coat the metal layer 101 on the substrate 100 or form the optional primer layer. The deposition time of the metal can be controlled to control the thickness of the metal coating 101. In some implementations, masks can be applied to selected regions of the substrate surface 118 to form a discontinuous metal layer 101 or a metal layer having different thickness in different regions.

Referring to FIGS. 1C and 1D, a coating composition is prepared that may include emulsifying agents defining an interface 106 between two liquid phases 104 and 105. The emulsion 102 includes a continuous liquid phase 105 and a dispersed liquid phase 104 that is immiscible with the continuous liquid phase and forms dispersed domains within the continuous liquid phase 105. In some implementations, the continuous phase 105 evaporates more quickly than the dispersed phase 104. One example of the emulsion 102 is a water-in-oil emulsion, where water is the dispersed liquid phase and the oil provides the continuous phase. The emulsion 102 can also be in the form of an oil-in-water emulsion. In one example, non-volatile etch-resistant components may be carried in either (1) the interface or (2) the continuous phase or (3) a combination of those two. In some implementations, location of etch resistant materials in those areas results in a contiguous network of etch resistant material upon drying the emulsion.

In another example, non-volatile etch-resistant components may be isolated to the discontinuous liquid phase 104. In such cases, upon drying the emulsion, etch resistant components may be isolated to discontinuous areas (e.g., pores). Etch resistant components useful in this implementation may be soluble in an aqueous phase, such as salts or gelling agents such as pectin and sodium alginate. This may be conducted, for instance, by use of a water-in-oil emulsion, wherein the etch-resistant material is generated from a chemistry such as a gelling agent, such as pectin or sodium alginate. For instance, a water-in-oil emulsion may be used with pectin or sodium alginate dissolved in the water phase, dried to form a random pattern on a substrate (e.g., discontinuous random polygons surrounded by nominally contiguous but gelling agent-free "traces"), and subsequently exposed to an acid causing formal gelation of the residue. As appropriate, the dried coating and substrate may be washed with an organic solvent such as acetone to remove any residual organic materials (such as emulsifiers, surfactants, rheology agents, or binders) from the "traces" of the network. Subsequently, the coating on the substrate may be exposed to an etchant, for instance an acidic etch, to remove the metal.

The coating composition can be prepared in a container 120 and subsequently coated onto the metal layer.

The emulsion 102 can include additional materials (further described below), but is preferably free of nanoparticles.

In the example shown in FIG. 1C, the non-volatile, etch-resistant component 106 is concentrated at an interface between the dispersed liquid phase 104 and the continuous liquid phase 105. In some implementations, the non-volatile, etch-resistant component 106 is dispersed within one or more phases, e.g., the dispersed phase and continuous phase, of the emulsion 102. The etch-resistant component 106 can be a photoresist. Suitable etch-resistant components 106 can include a polymeric material, such as a Novolac-type resin, epoxy resins, polyester polyols, alkanes and derivatives thereof having at least 15 carbon atoms, and combinations thereof. The etch-resistant component may also be curable using methods such as photo-curing or thermal curing.

In some instances, additional materials, e.g. binders and emulsifying agents, may also function as etch-resistant components. The etch-resistant component 106 is non-volatile at temperatures at which both the dispersed liquid phase 104 and the continuous liquid phase 105 evaporate, e.g. room temperature or slightly elevated room temperature.

The continuous phase 105 can include an organic solvent. Suitable organic solvents may include petroleum ether, hexanes, heptanes, toluene, benzene, dichloroethane, trichloroethylene, chloroform, dichloromethane, nitromethane, dibromomethane, cyclopentanone, cyclohexanone or any mixture thereof. Preferably, the solvent or solvents used in this continuous phase are characterized by higher volatility than that of the dispersed phase, e.g., the water phase.

Suitable materials for the dispersed liquid phase 104 can include water and/or water miscible solvents such as methanol, ethanol, ethylene glycol, propylene glycol, glycerol, dimethyl formamide, dimethyl acetamide, acetonitrile, dimethyl sulfoxide, N-methyl pyrrolidone.

The emulsion 102 may also contain at least one emulsifying agent, binder or any mixture thereof. Suitable emulsifying agents can include non-ionic and ionic compounds, such as the commercially available surfactants SPAN®-20 (Sigma-Aldrich Co., St. Louis, Mo.), SPAN®-40, SPAN®-60, SPAN®-80 (Sigma-Aldrich Co., St. Louis, Mo.), glyceryl monooleate, sodium dodecylsulfate, or any combination thereof. Examples of suitable binders include modified cellulose, such as ethyl cellulose with a molecular weight of about 100,000 to about 200,000, and modified urea, e.g., the commercially available BYK®-410, BYK®-411, and BYK®-420 resins produced by BYK-Chemie GmbH (Wesel, Germany).

The coating composition can be prepared by mixing all components of the emulsion 102 and the etch-resistant component 106. The mixture can be homogenized using an ultrasonic treatment, high shear mixing, high speed mixing, or other known methods used for preparation of suspensions and emulsions.

The composition can be coated onto the metal layer 101 using bar spreading, immersing, spin coating, dipping, slot die coating, gravure coating, flexographic plate printing, spray coating, or any other suitable techniques. In some implementations, the homogenized coating composition is coated onto the metal layer 101 until reaching a thickness of about 1 to 200 microns, e.g., 5 to 200 microns.

Referring particularly to FIGS. 1D-1E, the composition on the metal layer 101 is dried, e.g., heated to dry, in a controlled manner such that the continuous phase 105 of the emulsion 102 evaporates, while the dispersed liquid phase 104 and the non-volatile, etch-resistant component 106 remain on the metal layer 101. For example, the evaporation rate is controlled to be higher for the liquids in the continuous phase 105 than the liquids in the dispersed liquid phase 104. In the example in which the dispersed liquid phase 104 includes water, the previously dispersed water in the emulsion 102 forms distinct water droplets 107, and the non-volatile, etch-resistant component 106 forms, e.g., self-assembles into, an interconnected network 108 among the water droplets 107. The coated substrate 101 is further dried to remove the residual dispersed liquid phase 104, e.g., the coalesced water droplets 107, leaving the self-assembled, inter-connected etch-resistant traces defining openings that expose portions 122 of the metal layer 101 on the substrate 100.

Referring to FIG. 1F, the portions 122 of the metal layer 101 uncovered by the etch-resistant traces are removed to expose the surface 118 of the substrate 100. The removal can be performed using etching, such as wet etching, e.g., acid or base etching, or dry etching, e.g., plasma etching. The removal can also be performed by exposing the surface portions 122 to oxidizing agents such as ferric chloride and peroxides. The portions of the metal layer 101 covered by the etch-resistant traces are substantially not etched and remain on the substrate 100, forming an interconnected network. In some implementations, the etching process can be controlled, e.g., by selecting the type and concentration of the etchant, or the length of the etching process, to adjust the morphology of the metal network. For example, the surface portions 122 can be exposed to an etchant for a long period of time such that the etchant may laterally begin to etch the metal underneath the etch-resistant network, and the remaining metal traces 114 are thinner than the traces of the covering etch-resistant network. The so-formed transparent conductive coating can be more transparent and less conductive than a coating formed by a shorter period of etching time.

In some implementations, an etchant material is included within the emulsion 102. The etchant material may be concentrated in the dispersed liquid phase. When the emulsion 102 carrying both the etch-resistant component 106 and the etchant material is coated onto the metal layer 101, the etchant material starts etching the metal layer 101, while, simultaneously, the etch-resistant component 106 self-assembles into an interconnected network. By including the etchant within the emulsion 102, no separate etching step is required and the process of making the transparent conductive coating 110 can be simplified. The equipment requirements for the process can be reduced. When the etchant material is included in the emulsion, it is also possible to include agents or processes to trigger a simultaneous or controlled time or amount of etching, such as by using an external triggering agent such as ultraviolet radiation to generate a soluble acid agent, or exposing the entire sample to heat to trigger an etching chemistry.

Referring to FIG. 1G, optionally, the etch-resistant component is removed, e.g., by dissolution in an organic solvent or plasma stripping (using plasma stripping or plasma cleaning equipment such as can be purchased from, e.g. Yield Engineering Systems, Livermore, Calif.). In some implementations, the surface 118 can be cleaned to remove possible residual materials from the emulsion 102. The properties, e.g., transparency or conductivity, of the formed interconnected network of the metal traces 114 can be further adjusted. For example, reflectivity of the metal network can be changed by changing the color of the metal coating 110, e.g., by anodizing a surface portion of the metal network.

In other implementations, the substrate 100 can be removed to form a free-standing metal network. The substrate 100 can be a sacrificial substrate made from a material that can be dissolved or softened. In one instance, a water soluble film, e.g. polyvinyl alcohol, can be used and dissolved with warm water. In another instance, an organic solvent soluble film, e.g. polycarbonate or PMMA, can be used and dissolved with appropriate organic solvents. In these instances, care must be taken to avoid emulsion solvents that would prematurely soften or dissolve the substrate.

The transparent conductive coating 110 can have a transparency of about 30% to 95% with respect to light having a wavelength of 400 nm to 700 nm, and a haze value in the range of about 0.1%-10%. The electrical resistance of the coating 110 is about 0.1 Ω/square to 10 kΩ/square. Features of transparent conductive coatings are also described in U.S. Pat. Nos. 7,566,360, 7,736,693, and 7,601,406, the entire contents of which are incorporated herein by reference.

EXAMPLE 1

Figure 5:
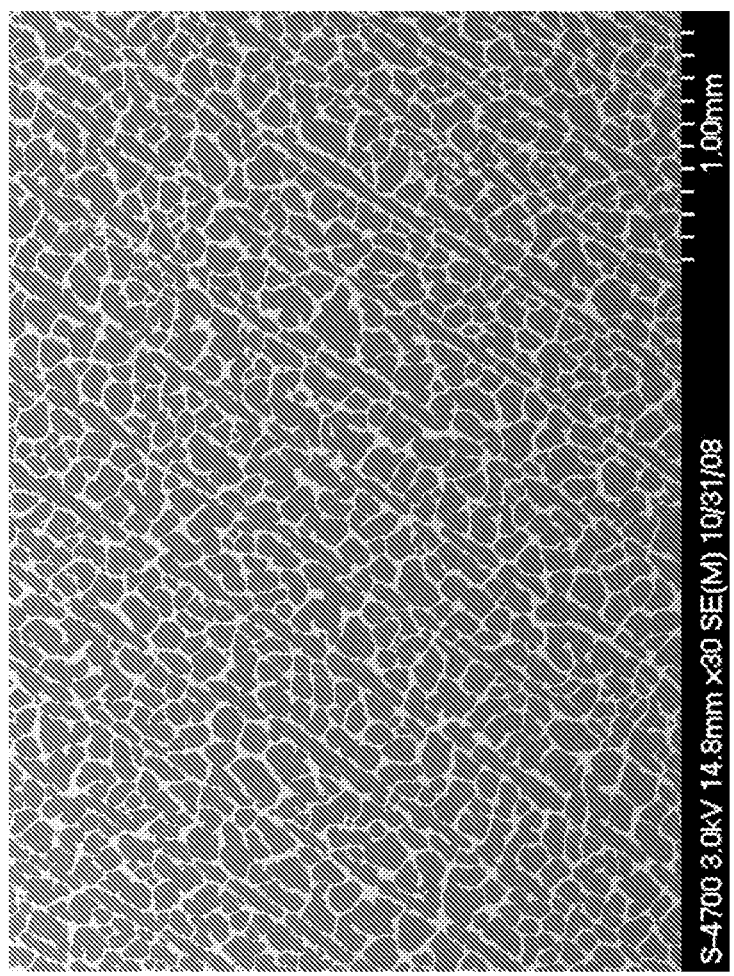
FIGS. 5 and 6 are scanned electron micrographs of transparent copper conductive coatings.
Figure 6:
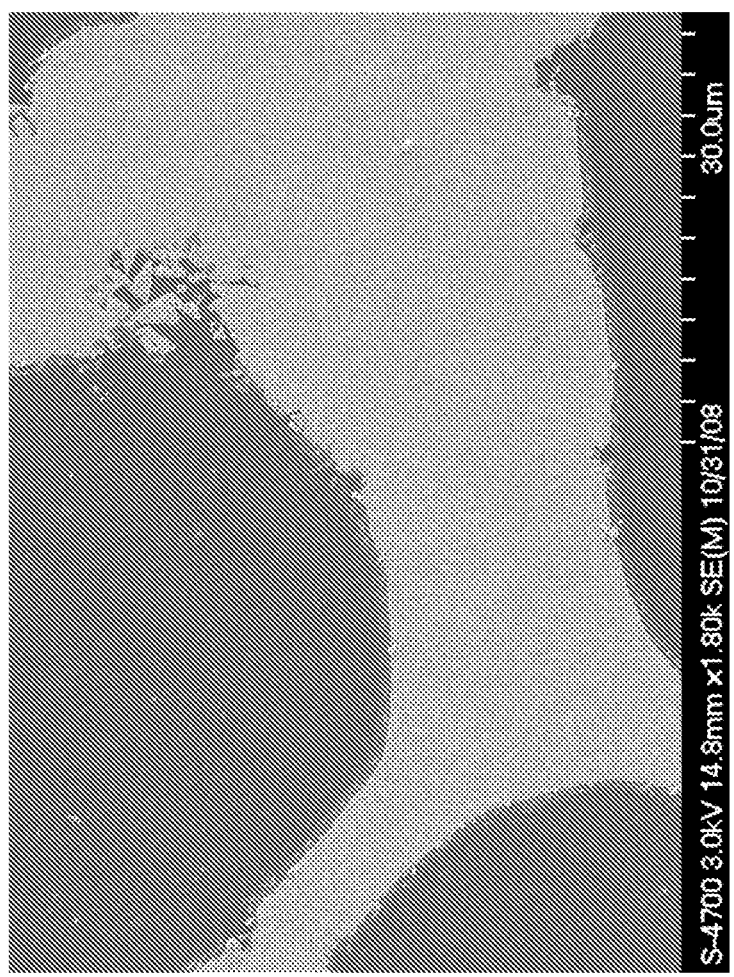
Figure 7:
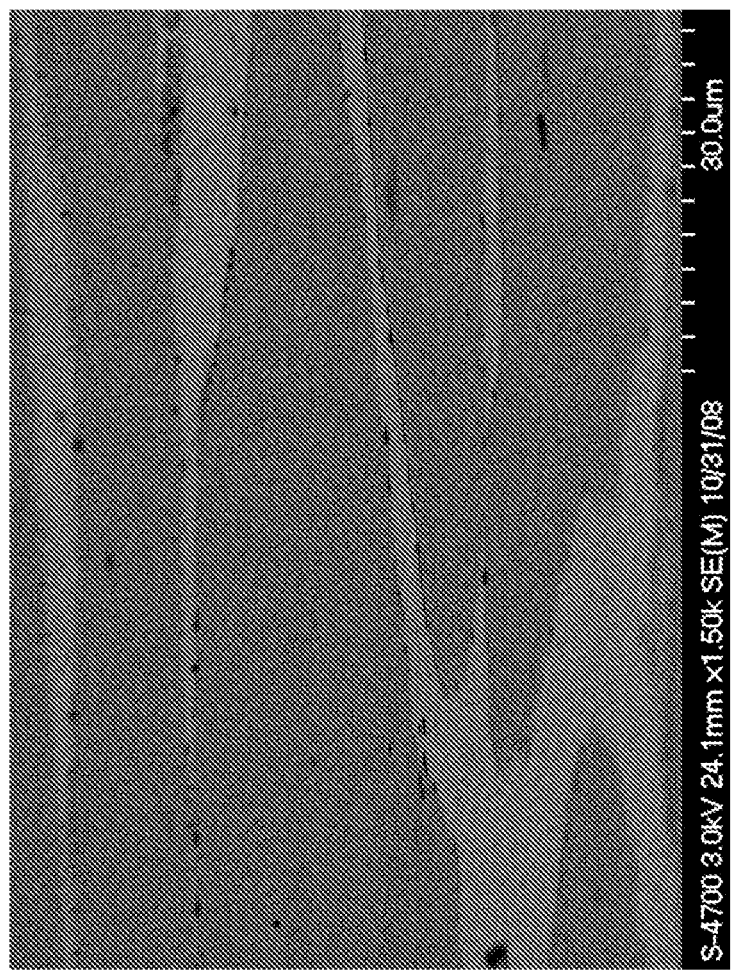
FIGS. 7 and 8 are scanned electron micrographs of transparent copper conductive coatings, taken at glancing angles.
Figure 8:
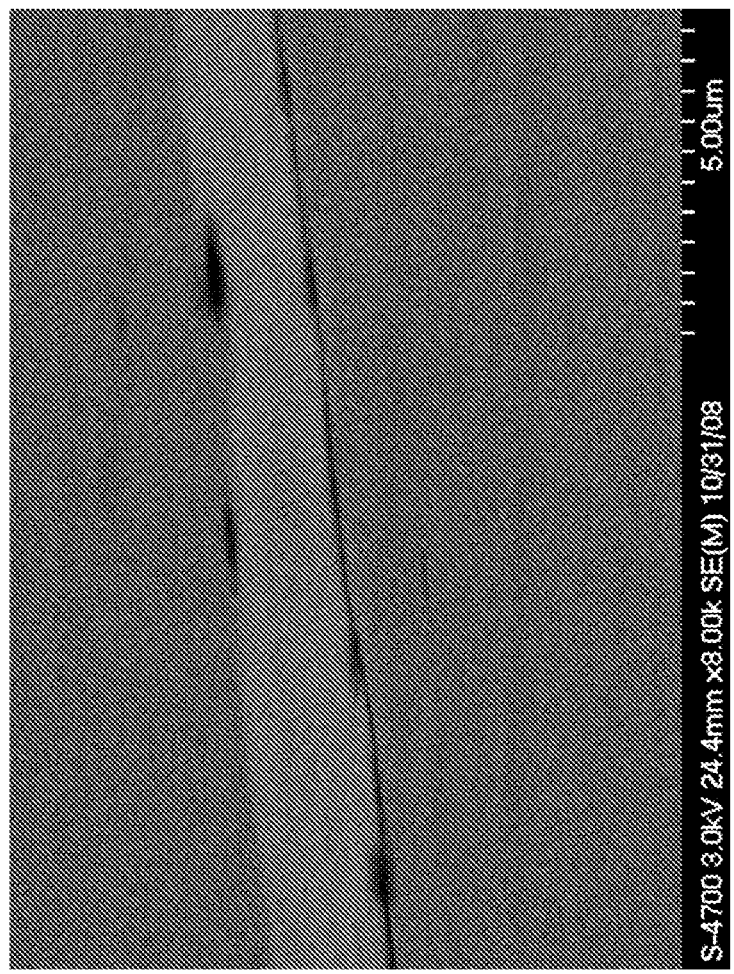

A copper transparent conductive coating similar to that shown in FIG. 2 and FIG. 5 was formed on a transparent plastic substrate. A copper-coated polyethylene terephthalate substrate from Solutia Performance Films (St. Louis, Mo.) was provided. The copper coating had a thickness of about 200 nm and a nominal sheet resistance of 0.8 Ohms/square as measured by a Loresta-GP MCP T610 4 point probe (Mitsubishi Chemical, Chesapeake, Va.). The polyethylene terephthalate substrate had a thickness of about 60 microns and a surface area of 8.5 inches by 11 inches (or about 21.25 cm by about 27.5 cm).

First, a wet primer with the composition:
  (a) 0.28 g poly[dimethylsiloxane-co-[3-(2-(2-hydroxyethoxy)ethoxy)propyl]methylsiloxane] (catalog no. 480320, Sigma-Aldrich, St. Louis, Mo.);
  (b) 0.60 g Synperonic NP30 (polyethylene glycol nonylphenyl ether, Sigma-Aldrich); and
  (c) 99.12 g acetone;
was coated onto the copper coating using a Mayer Rod to give a wet thickness of approximately 13 microns. The acetone was then allowed to evaporate.

Next, a coating composition including an emulsion and an etch-resistant component was prepared by mixing the following materials using an ultrasonicating dispersing system:
  (a) 0.76 g Novolac resin (D.E.N. 438™ Epoxy Novolac Resin from the Dow Chemical Company, Midland, Mich.);
  (b) 18.5 g toluene;
  (c) 1.66 g cyclohexanone;
  (d) 0.096 BYK 410 (rheological agent including a modified urea from BYK-Chemie GmbH, Wesel, Germany); and
  (e) 10.7 g water-based solution.

The water-based solution included 0.02 wt % of BYK®-348 (BYK-Chemie GmbH, Wesel, Germany), a polyether modified siloxane wetting agent, in water.

Approximately 3 ml of the coating composition was deposited onto the copper coating of the primed substrate. Subsequently, a Mayer rod was used to spread the mixed material across the entire copper surface, forming a wet coating of approximately 41 microns thickness. The coating was then dried at room temperature and under room humidity conditions for approximately 90 seconds, during which time etch-resistant traces were formed (i.e. self-assembled) on the copper coating.

The copper coating was then etched by immersing the article (the coated substrate) in a solution including 20 wt % $FeCl_3$ in water for about 45 seconds. The article was then washed with water and allowed to dry at room temperature. The copper transparent conductive coating 110 having an interconnected network made of copper traces 114 was formed. The copper transparent conductive coating 110 had a sheet resistance of 35 Ohm/square and 71% transparency to visible light, as measured by taking the ratio of measured light incident on a Greenlee Digital Light Meter 93 172 (Greenlee, Southhaven, Miss.) when placed underneath the film to the light incident on the same meter in the absence of such a film in conventional fluorescent-bulb lab lighting benchtop conditions.

FIGS. 3A and 3B show optical images of the copper transparent conductive coating 110 in a reflectance mode and in a transmission mode, respectively. FIGS. 5-8 are scanned electron micrographs (SEM) of the copper transparent conductive coating on the polyethylene terephthalate substrate. The copper coating includes a substantially flat, dense copper network.

EXAMPLE 2

Figure 4:
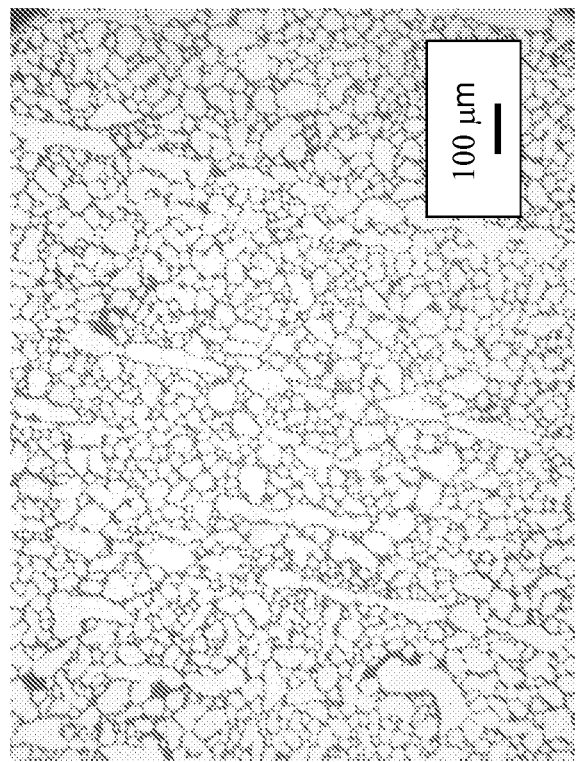
FIG. 4 is a scanned electron micrograph of a transparent aluminum conductive coating.

An aluminum transparent conductive coating 200 similar to that shown in FIG. 4 was formed on a transparent plastic substrate. An aluminum-coated polyethylene terephthalate substrate from Solutia Performance Films (St. Louis, Mo.) was provided and primed as described in Example 1.

A coating composition including an emulsion and an etch-resistant component having the following composition:
  (a) 0.025 g Cymel 303 (a hexamethoxymethylmelamine crosslinking agent, Cytec Industries, West Patterson, N.J.);
  (b) 0.078 K-FLEX A307 (a low viscosity, saturated, aliphatic polyester diol, King Industries, Inc., Norwalk, Conn.);
  (c) 0.093 Nacure 2501 (an amine blocked toluenesulfonic acid catalyst, King Industries, Inc.);
  (d) 18.5 g toluene;
  (e) 1.66 g cyclohexanone;
  (f) 0.096 g BYK 410; and
  (g) 10.7 g water-based solution including 0.02 wt % of BYK 348
was prepared by mixing using an ultrasonicating dispersing system.

Figure 9:
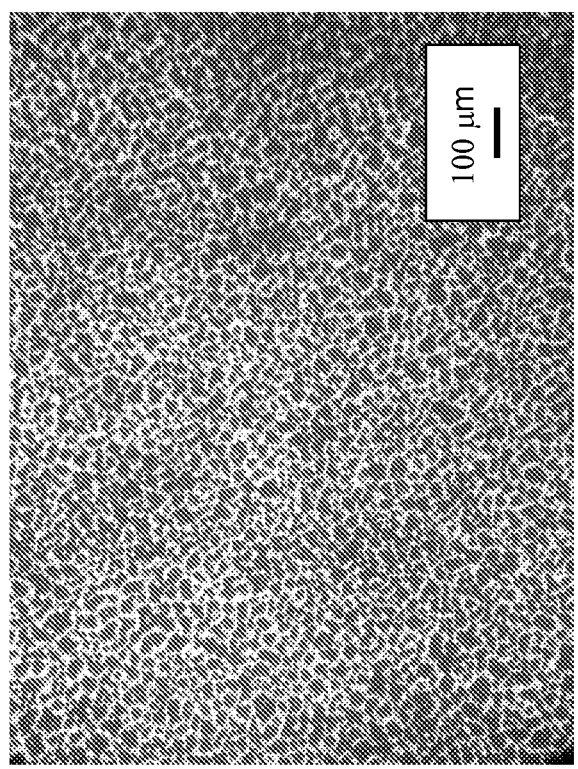
FIG. 9 is a scanned electron micrograph of a transparent aluminum conductive coating.

Approximately 3 ml of the coating composition was coated onto the aluminum coating of the substrate using a Mayer rod to give a wet thickness of approximately 41 microns. The coated material was then dried at room temperature and ambient humidity for approximately 90 seconds, during which time etch-resistant traces formed on the aluminum coating. The aluminum coating was then etched, cleaned, and dried in a similar way to those described in Example 1. The resulting aluminum transparent conductive coating 200 included an interconnected network formed of aluminum traces 202, which define cells 204. FIG. 9 shows an optical image of the aluminum transparent conductive coating 200 in a reflectance mode.

EXAMPLE 3

A copper transparent conductive coating similar to that shown in FIG. 2 was formed on a transparent plastic substrate using an emulsion that contained an etchant. The same copper-coated polyethylene terephthalate substrate as described in Example 1 was provided. No primer was used.

A coating composition including an emulsion, an etch-resistant component, and an etchant was prepared by mixing the following materials with an ultrasonicating dispersing system:
  (a) 0.0735 g BYK®-410;
  (b) 0.0699 g K-FLEX® A307;
  (c) 0.0310 g Span® 60 (sorbitan monooctadecanoate, Sigma-Aldrich Co.);
  (d) 0.0160 g poly[dimethylsiloxane-co-[3-(2-(2-hydroxyethoxy)ethoxy)propyl]methylsiloxane] (catalog no. 480320, Sigma-Aldrich);
  (d) 0.8551 g cyclohexanone;
  (e) 12.3086 g toluene;
  (f) 0.9771 g iron chloride ($FeCl_3$);
  (g) 0.0049 g BYK®-348; and
  (h) 8.9388 g deionized water.

The coating composition was applied onto the copper surface using a Mayer rod #18 to coat an emulsion of approximately 41 microns thickness, and the sample was subsequently dried. In about 2 minutes, the etch resist in the emulsion formed an interconnected network on the copper, while the copper was simultaneously etched by the iron chloride etchant in the emulsion to form the transparent conductive coating. The article was then rinsed with a solution containing water and acetone, and dried.

Other embodiments are within the scope of the following claims.

What is claimed is:

1. A method of producing an article comprising:
   (a) providing a substrate comprising a metallized surface layer;
   (b) coating the metallized surface layer with a composition comprising a non-volatile, etch-resistant component in a volatile liquid carrier,
   wherein the composition is essentially free of nanoparticles and the liquid carrier is in the form of an emulsion comprising aqueous domains dispersed in a continuous phase comprising an organic solvent that evaporates more quickly than the aqueous domains;
   wherein the non-volatile, etch-resistant component is selected from the group consisting of Novolac resins, epoxy resins, polyester polyols, alkanes having at least 15 carbon atoms, and combinations thereof;
   wherein the composition further comprises an etching agent;
   (c) drying the composition to remove the liquid carrier, whereupon the non-volatile, etch-resistant component self-assembles to form interconnected etch-resistant traces on the metallized surface layer defining randomly shaped cells and the etching agent etches areas of the metallized surface layer not covered by the etch-resistant traces to expose the underlying substrate.

2. The method of claim 1, further comprising removing the etch-resistant traces to expose areas of the metallized surface layer underlying the etch-resistant traces.

3. The method of claim 2, further comprising adjusting the conductivity of the exposed areas of the metallized surface area.

4. The method of claim 2, further comprising anodizing a surface portion of the exposed area of the metallized surface area.

5. The method of claim 1, wherein the metallized layer is selected from the group consisting of copper, silver, aluminum, and combinations thereof.

6. The method of claim 1, wherein the metallized surface layer is in the form of a substantially continuous layer on the substrate.

7. The method of claim 1, wherein etching areas of the metallized surface layer not covered by the etch-resistant component comprises exposing the areas to a plasma.

8. The method of claim 1, wherein etching areas of the metallized surface layer not covered by the etch-resistant component comprises exposing the areas to an agent selected from the group consisting of acids, bases, oxidizing agents, and combinations thereof.

9. The method of claim 1, wherein the substrate is transparent to visible light in the absence of the metallized surface layer.

10. The method of claim 1, wherein the coating step comprises forming a substantially continuous coating on the metallized surface layer.

* * * * *